United States Patent
Takahashi

(10) Patent No.: US 8,177,577 B2
(45) Date of Patent: May 15, 2012

(54) PRINTED WIRING BOARD HAVING A SUBSTRATE WITH HIGHER CONDUCTOR DENSITY INSERTED INTO A RECESS OF ANOTHER SUBSTRATE WITH LOWER CONDUCTOR DENSITY

(75) Inventor: Michimasa Takahashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 359 days.

(21) Appl. No.: 12/453,718

(22) Filed: May 20, 2009

(65) Prior Publication Data

US 2009/0290318 A1 Nov. 26, 2009

Related U.S. Application Data

(60) Provisional application No. 61/071,909, filed on May 23, 2008.

(51) Int. Cl.
*H05K 1/11* (2006.01)
(52) U.S. Cl. ..................................................... 439/392
(58) Field of Classification Search .......... 174/250–262; 361/761–795
See application file for complete search history.

(56) References Cited

U.S. PATENT DOCUMENTS

| 5,562,971 | A | * | 10/1996 | Tsuru et al. ................... 428/209 |
| 5,847,935 | A | * | 12/1998 | Thaler et al. .................. 361/761 |
| 5,858,145 | A | * | 1/1999 | Sreeram et al. ............ 156/89.16 |
| 6,281,446 | B1 | | 8/2001 | Sakamoto et al. |
| 7,019,221 | B1 | * | 3/2006 | Noda ............................. 174/255 |
| 7,886,438 | B2 | * | 2/2011 | Ito et al. .......................... 29/852 |

FOREIGN PATENT DOCUMENTS

| GB | 2 346 740 | 8/2000 |
| JP | 11-317582 | 11/1999 |
| JP | 2000-165007 | 6/2000 |
| JP | 3795270 B | 4/2006 |

OTHER PUBLICATIONS

U.S. Appl. No. 12/453,632, filed May 18, 2009, Takahashi.

* cited by examiner

*Primary Examiner* — Chandrika Prasad
(74) *Attorney, Agent, or Firm* — Oblon, Spivak, McClelland, Maier & Neustadt, L.L.P.

(57) ABSTRACT

A printed wiring board includes a first substrate having a recess portion and multiple conductors, a second substrate having multiple conductors and inserted in the recess portion of the first substrate such that the first substrate has a surface exposing at least a portion of a surface of the second substrate. The multiple conductors in the first substrate is electrically connected to the multiple conductors in the second substrate, and the second substrate has density of the conductors which is higher than density of the conductors of the first substrate.

19 Claims, 14 Drawing Sheets

PRINTED WIRING BOARD HAVING A SUBSTRATE WITH HIGHER CONDUCTOR DENSITY INSERTED INTO A RECESS OF ANOTHER SUBSTRATE WITH LOWER CONDUCTOR DENSITY

CROSS-REFERENCE TO RELATED APPLICATIONS

The present application claims the benefits of priority to U.S. Application No. 61/071,909, filed May 23, 2008. The contents of that application are incorporated herein by reference in their entirety.

BACKGROUND OF THE INVENTION

1. Field of the Invention

The present invention relates to a printed wiring board and a method for manufacturing the same.

2. Discussion of the Background

As to a printed wiring board and a method for manufacturing the same, what is described in the Japanese Patent No. 3795270 has been put forth. The Patent Document No. 3795270 describes a multilayer printed wiring board in which in a single substrate a high density region where conductor bumps are formed in a high density and a low density region where conductor bumps are formed in a low density are concurrently present, and these high density region and low density region are arranged in appropriate combinations. The contents of this publication are incorporated herein by reference in their entirety.

SUMMARY OF THE INVENTION

According to one aspect of the present invention, a printed wiring board includes a first substrate having a recess portion and multiple conductors, a second substrate having multiple conductors and inserted in the recess portion of the first substrate such that the first substrate has a surface exposing at least a portion of a surface of the second substrate. The multiple conductors in the first substrate is electrically connected to the multiple conductors in the second substrate, and the second substrate has density of the conductors which is higher than density of the conductors of the first substrate.

According to another aspect of the present invention, a method for manufacturing a printed wiring board includes forming a first substrate having multiple conductors, forming from a single substrate multiple second substrates each having multiple conductors, forming a recess portion for inserting one or more of the second substrates in the first substrate, disposing one or more of the second substrates in the recess portion formed in the first substrate such that one or more of the second substrates has at least a portion of a surface exposed at a surface of the first substrate, and electrically connecting the multiple conductors in the first substrate and the multiple conductors in the second substrates.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
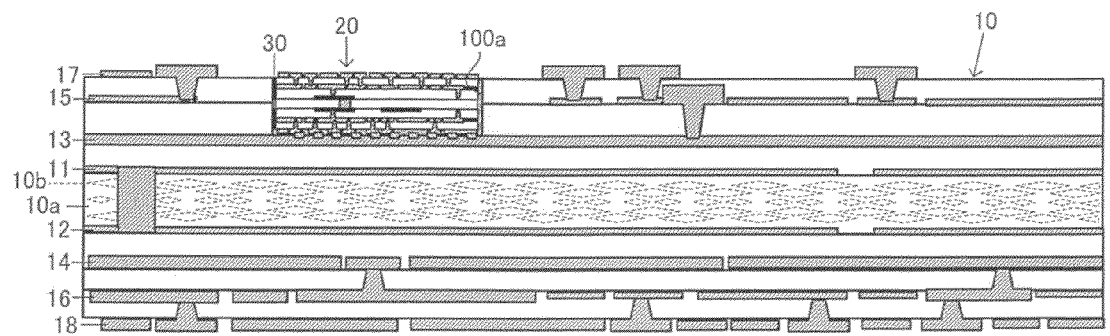
FIG. 1 is a sectional view illustrating, as to one embodiment of a printed wiring board and a method for manufacturing the same pertaining to this invention, a schematic structure of a printed wiring board pertaining to the same embodiment.

The embodiments will now be described with reference to the accompanying drawings, wherein like reference numerals designate corresponding or identical elements throughout the various drawings.

A printed wiring board pertaining to one embodiment in accordance with the present invention is, as a sectional structure thereof is illustrated in FIG. 1, provided, from a larger perspective, with the first substrate 10 and the second substrate 20 inserted such that the main face thereof is exposed at the surface of the first substrate 10. In addition, this printed wiring board is a so-called rigid multilayer board. And, each of the first substrate 10 and the second substrate 20 constituting this printed wiring board is also a printed wiring board.

The first substrate 10 is provided with a non-flexible base material (10a) (corresponding to the core substrate of the first substrate 10) containing an inorganic material, for example, (glass cloth, silica filler, glass filler, to give examples). This non-flexible substrate (10a) has, as illustrated with dotted lines in FIG. 1, a cloth layer (10b) on account of an inorganic material. And, on the front and back of the first substrate 10 wiring layers 11-18 each composed of a conductor (copper, for example) are patterned and formed in lamination via interlaminar insulating layers.

Figure 2:
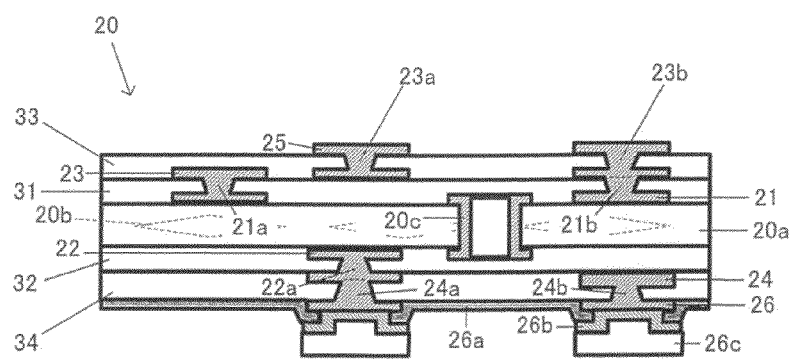
FIG. 2 is a sectional view illustrating a schematic structure of the second substrate.
Figure 3:
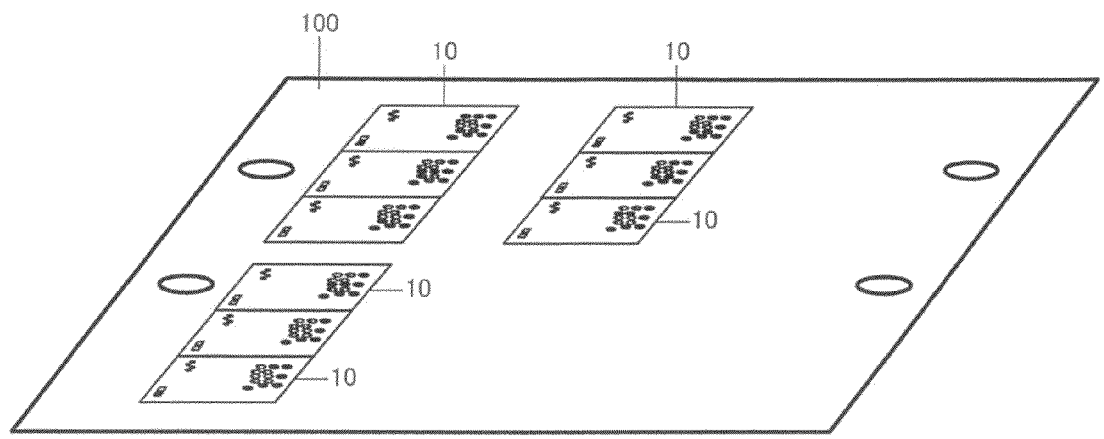
FIG. 3 is a perspective view illustrating a step of fabricating the first substrate under a method for the manufacture of the same embodiment.
Figure 4:
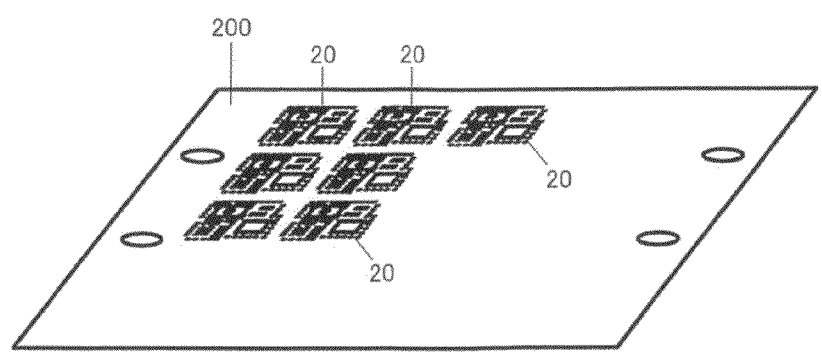
FIG. 4 is a perspective view illustrating a step of fabricating the second substrate under a method for the manufacture of the same embodiment.

The second substrate 20 is provided, as illustrated in FIG. 2 with a portion thereof being enlarged, with a non-flexible base material (20a) containing an inorganic material, for example, (glass cloth, silica filler, glass filler, to give examples). This non-flexible base material (20a) corresponds to the core substrate of the second substrate 20, the thickness thereof being less (thinner) than the thickness of the core material (a non-flexible base material 10a) of the first substrate 10 and having a cloth layer (20b) on account of an inorganic material as illustrated in FIG. 1 with dotted lines. Further, on the front and back of the non-flexible base material (20a) there are formed an insulating material 31 through 34, wiring layers 21-26 composed of conductor patterns (copper patterns, for example), and interlaminar connections (21a, 21b, 22a, 23a, 23b, 24a, 24b) for providing electrical connections between the wiring layers. To be specific, on the front and back of the non-flexible base material (20a) there are formed wiring layers 21, 22, and these wiring layers 21, 22 are electrically connected to wiring layers 23, 24 being upper layers thereof via interlaminar connections (21a, 21b, 22a) composed of copper, for example, in insulating material 31, 32 for interlaminarly insulating from the upper layer of each. Further, wiring layers 23, 24 are electrically connected to wiring layers 25, 26 being upper layers thereof via interlaminar connections (23a, 23b, 24a, 24b) composed of copper, for example, in the insulating material 33, 34 for interlaminarly insulating from the upper layers thereof. As such, the wiring layers are mutually electrically connected. And, in the non-flexible base material (20a) there is formed a through connection (20c) for connecting conductor patterns on the front and back thereof with copper, etc., for example, being through-hole plated. Further, on one of the main faces of the substrate (here, the surface of the insulating material 34) there is provided a passivation film (a protective film) (26a), and in that passivation film 26a there are formed windows to allow the wiring layers 26 (pads) to be selectively exposed. And, in those windows there are formed bump metals (26c) such that it is electrically connected to the wiring layers 26 via buffer layers (26b) composed of an adhesive layer and a dispersion barrier layer.

The second substrate 20 is disposed in a recess portion (indentation portion) (100a) of the first substrate 10 and flip-chip mounted onto the first substrate 10. The bump metals (26c) of the second substrate 20 are directly joined to the terminals (lands) provided on the circuit of the first substrate 10 by being so-called face-down. As such, the first substrate 10 and the second substrate 20 are electrically connected. The structure being as such, the first substrate 10 and the second substrate 20 can easily be electrically connected.

It is set up such that the number of wiring layers per unit thickness with respect to the second substrate 20 is greater than the number of wiring layers per unit thickness with respect to the first substrate 10 (a number of wiring layers within a given thickness (a certain thickness as a unit, "a unit thickness")), and upon the number of wiring layers in the regions of the same thickness between the two, it results in the second substrate 20 being higher in the density of the conductors present than the first substrate 10. As such, when it comes to said printed wiring board, the number of wiring boards formed with the conductors of the second substrate 20 is greater than the number of wiring layers in the first substrate 10 in the regions of the same thickness as that of the second substrate 20. The structure being as such, a high-density conductor region can be easily be formed, which in turn allows said printed wiring board to be easily fine-pitched in portions as well.

And, the thickness of at least a portion of the wiring layers (conductor circuits) of the second substrate 20 is the same as the thickness of the conductor circuits of the first substrate 10. However, the thickness of at least a portion of the conductor circuits of the second substrate 20 may be thinner than the thickness of the conductor circuits of the first substrate 10.

There is present a filling of a resin 30 composed of RCF (Resin Coated Copper Foil), for example, (or possibly a prepreg, etc.) between the first substrate 10 and the second substrate 20. Namely, the first substrate 10 and the second substrate 20 are physically mutually connected and adhered (insulated electrically) via the resin 30. This resin 30 may be composed of the same material as the resin constituting an insulating material 31-34.

As such, the connection between the first substrate 10 and the second substrate 20 via the resin 30 enhances the adhesion force between the first substrate 10 and the second substrate 20. And, the resin 30 filling in constitutes a buffer material allowing the connection reliability of the wiring of the second substrate 20 having a higher wiring density than the first substrate 10 to be enhanced on account of an impact, when the impact is applied from the outside as well, not being directly transmitted to the second substrate 20. And, the embedding of the second substrate 20 separately fabricated allows the complicated steps that come with a build-up to be simplified. Further, since the rigidity of the insulating layer of the first substrate 10 is greater than that of the insulating layer of the second substrate 20, the stress applied to the second substrate 20 can be eased.

When it comes to the manufacture of such printed wiring boards, a considerable number (around "32 units," for example) of the first substrates on a single substrate 100 and a considerable number (around "96 units," for example) of the second substrates on a single substrate 200 are manufactured with a semiconductor process respectively.

To be specific, the first substrates 10 and the second substrates 20 are manufactured by wiring layers being sequentially laminated on the front and back of the core substrates (non-flexible substrates) (10a, 20a) respectively via insulating layers. Since these first substrates 10 and second substrates 20 are, while differing in the number of wiring layers, fundamentally manufactured with similar processes, only the manufacture process of the second substrates 20 is herein indicated in details and the details of the manufacture process of the first substrates 10 are omitted.

When it comes to the fabrication of the second substrates 20, a non-flexible base material (20a) having on the front and back copper foils (601a, 601b) is prepared, as illustrated in FIG. 5(a), for example, and a through hole 602 is formed with a hole-boring process, as illustrated in FIG. 5(b), for example. Then, it is polished and a through connection (20c) for connecting the conductor patterns on the front and back of the substrate by being subjected to PN-plating (chemical copper plating and electro-copper plating, for example), as illustrated in 5(c), for example, and concurrently conductor films (603a, 603b) each composed of copper, for example, are formed on the front and back of the non-flexible substrate (20a). And, those conductor films (603a, 603b) are patterned with a predetermined photo etching (acid washing, resist laminate, direct depicting (exposure), development, etching, stripping, etc., for example) to form wiring layers 21, 22, as illustrated in FIG. 5(d), for example. As such, the first wiring layer of the second substrate 20 is formed. Then, it is inspected with an image checker, etc., and the formation of the second wiring layers being upper layers with black-oxide treatment being further performed goes underway.

When it comes to the formation of the second wiring layer, on the front and back of the structure on which the above-described first wiring layers are formed there are disposed insulating materials 31, 32 composed of a prepreg, for example, and conductor films (604a, 604b) composed of a copper foil, for example. And, a pressure is applied to the conductor films (604a, 604b) being the outermost layers with a hydropress device, for example, and the structure in the entirety thereof is pressure-pressed, as illustrated in FIG. 6(b), for example.

Next, it undergoes trimming (edge-face cutting and imprinting), hole-boring for alignment, soft-etching, and laser pre-treatment, and vias 605 are formed with laser, as illustrated in FIG. 6(c), for example. Further, after it has been desmeared (smear removal) and soft-etched, conductors (606a, 606b) are formed on the front and back of the structure respectively by carrying out PN-plating (chemical copper-plating and electro-copper plating, for example), as illustrated in FIG. 6(d), for example. And, following the formation of these conductors (606a, 606b), it undergoes an indentation inspection as a step inspection.

Continuing on, the conductor films (606a, 606b) are patterned with a predetermined photo etching (acid washing, resist laminate, direct depicting (exposure), development, etching, stripping, etc., for example) to form wiring layers 23, 24, as illustrated in FIG. 6(e), for example. As such, the second wiring layers of the second substrate 20 are also formed. Then, it is inspected with an image checker, etc., and the formation of the third wiring layers being upper layers with black-oxide treatment being further performed goes underway.

When it comes to the formation of the third wiring layers, on the front and back of the structure constituting the above-described first wiring layers and second wiring layers there are disposed insulating materials 33, 34 composed of a prepreg, for example, and conductor films (607a, 607b) composed of a copper foil, for example. And, a pressure is applied to the conductor films (607a, 607b) being the outermost layers with a hydropress device, for example, and the structure in the entirety thereof is pressure-pressed, as illustrated in FIG. 7(b), for example.

Next, it undergoes trimming (edge-face cutting and imprinting), hole-boring for alignment, soft-etching, and laser pre-treatment, and vias (via structures) 608 are formed with laser, as illustrated in FIG. 7(c), for example. Further, after it has been desmeared (smear removal) and soft-etched, conductors (609a, 609b) are formed on the front and back of the structure respectively by carrying out PN-plating (chemical copper-plating and electro-copper plating, for example), as illustrated in FIG. 7(d), for example. And, following the formation of these conductors (609a, 609b), it undergoes a recess portion (an indentation portion) inspection as a step inspection.

Continuing on, the conductor films (609a, 609b) are patterned with a predetermined photo etching (acid washing, resist laminate, direct depicting (exposure), development, etching, stripping, etc., for example) to form wiring layers 25, 26, as illustrated in FIG. 7(e), for example. As such, the third wiring layers of the second substrate 20 are also formed. Then, it is inspected with an image checker, etc., and undergoes black-oxide treatment, and, continuing on, a passivation film 26a is formed on the surface of an insulating material 34. And, in that passivation film (26a) there are formed windows allowing the wiring layers 26 to be selectively exposed, and in those windows there are formed buffer layers (26b) and, further, bump metals (26c). As such, the second substrate 20 as illustrated in the preceding FIG. 2 is completed.

Figure 5:
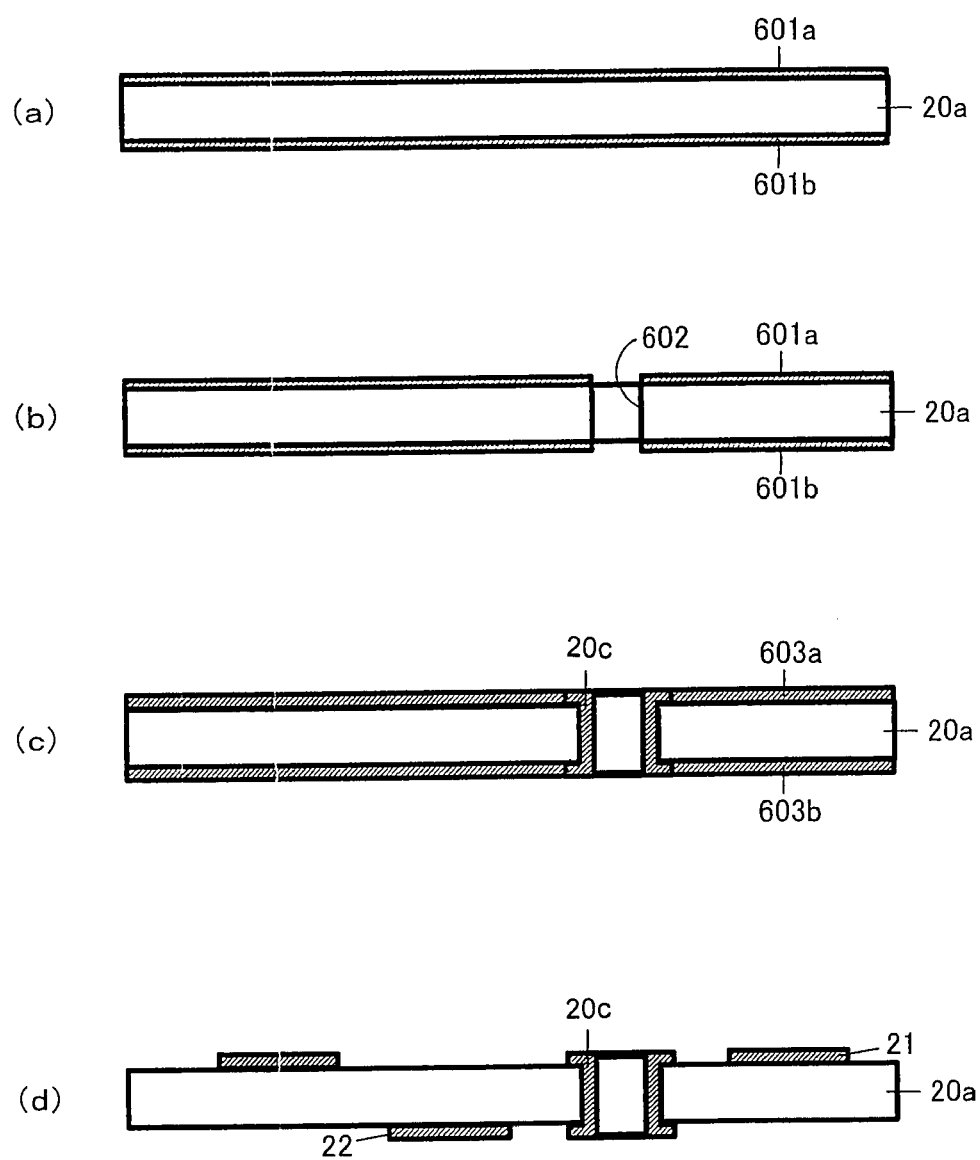
FIGS. 5(a) through (d) are sectional views illustrating a step of forming the first wiring layer of the second substrate under a method for the manufacture of the same embodiment.
Figure 6:
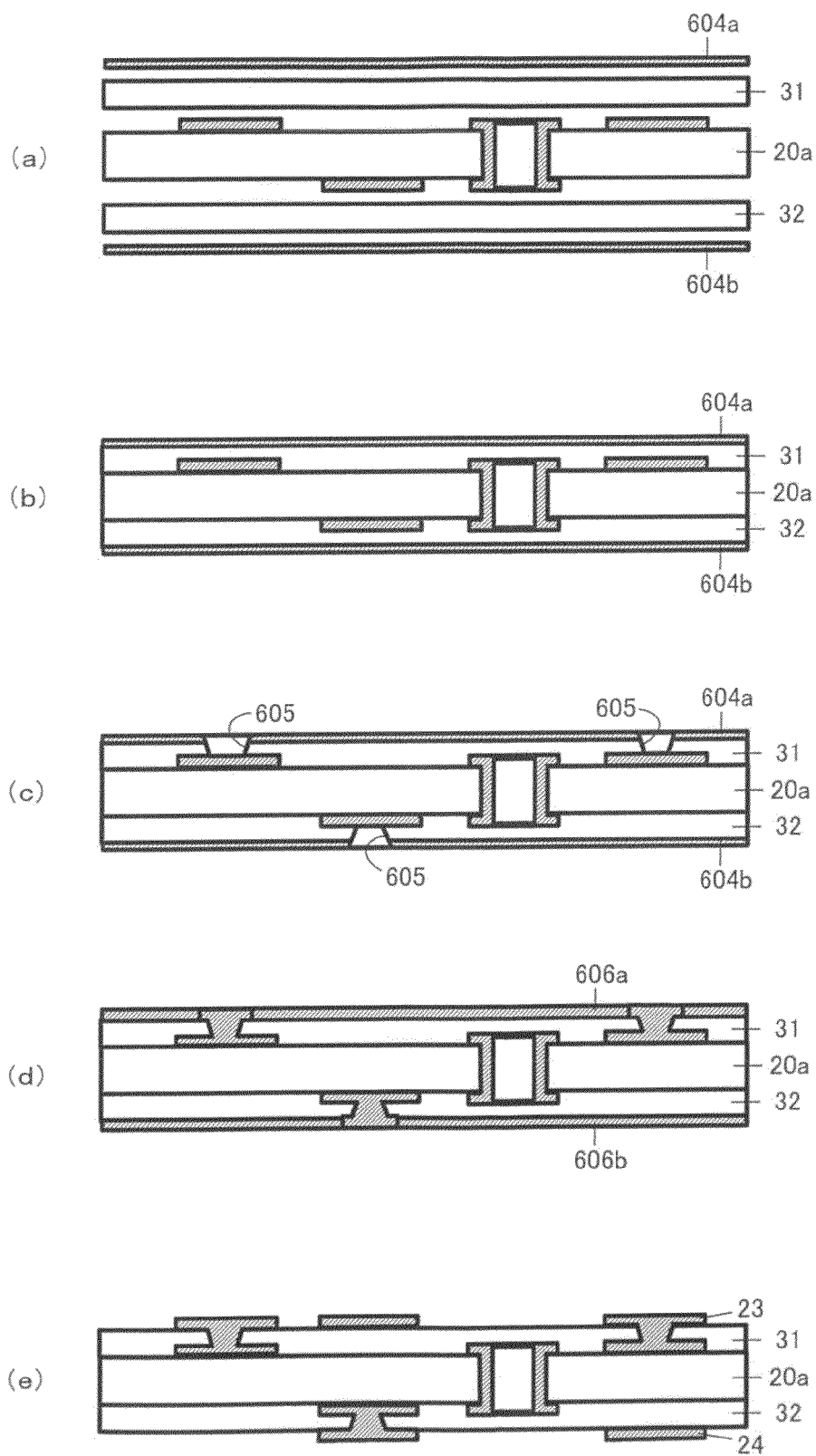
FIGS. 6(a) through (e) are sectional views illustrating a step of forming the second wiring layer of the second substrate under a method for the manufacture of the same embodiment.
Figure 7:
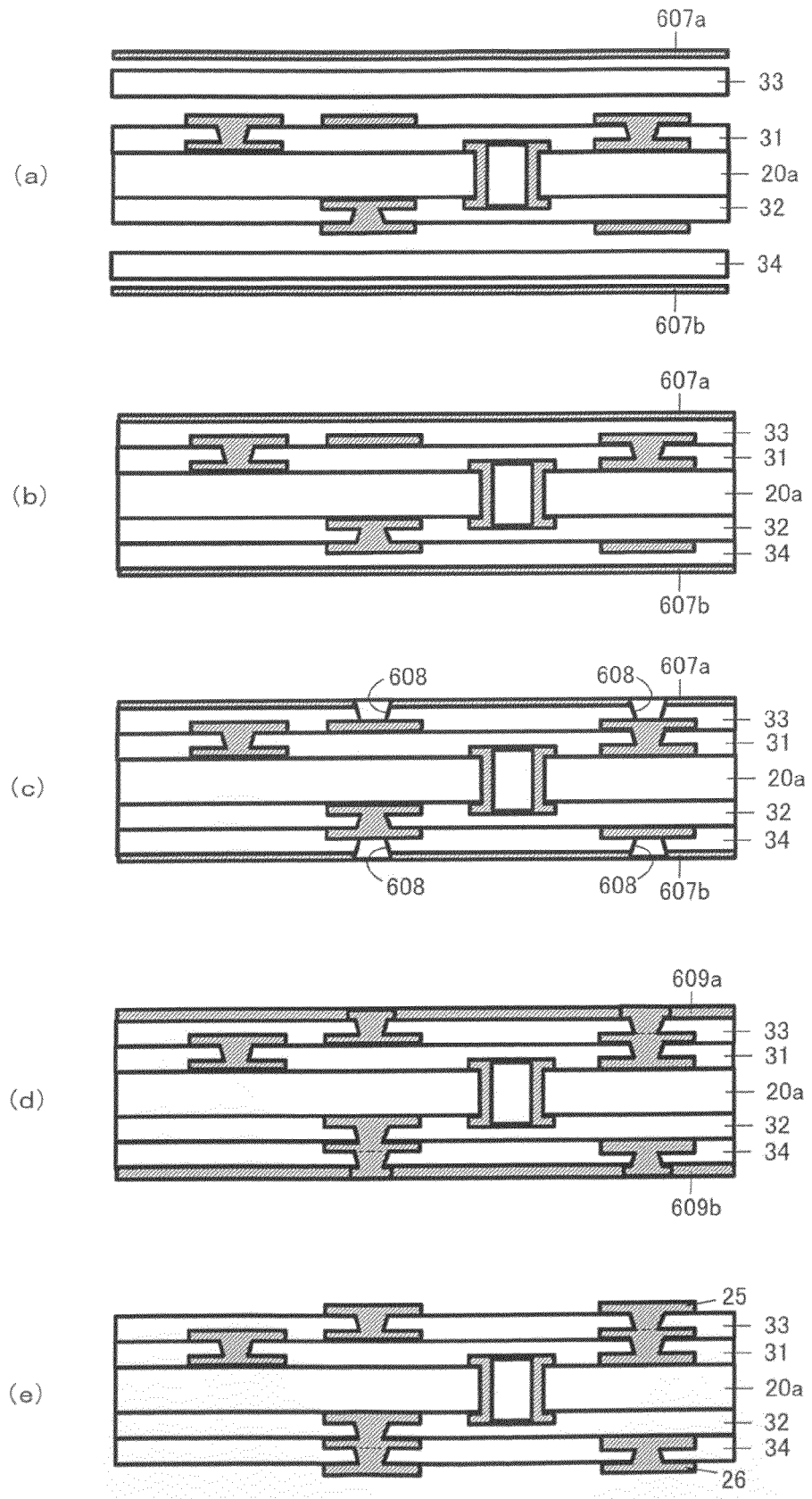
FIGS. 7(a) through (e) are sectional views illustrating a step of forming the third wiring layer of the second substrate under a method for the manufacture of the same embodiment.

The first substrate 10 can also be fabricated by wiring layers 11-18 each via an interlaminar insulating layer on the front and back of a non-flexible substrate 10a through the steps following the steps illustrated in FIG. 5 through FIG. 7 described above.

Following the fabrication of the first substrates 10 and the second substrates 20 as in the above, those substrates 10, 20 formed on the substrate 100 and the substrate 200 are checked as to pass (defect-free) or fail (defective), and a determination is made, among them, as to which substrates are normal (defect-free) and which substrates are abnormal (defective). The substrates 10, 20 determined to be failed (defective) are discarded as necessary. In addition, as to the inspection of substrates 10, 20, they are subjected to an inspection with an image checker, etc., for example. Further, then, substrates 10, 20 are subjected to black-oxide treatment.

Figure 8:
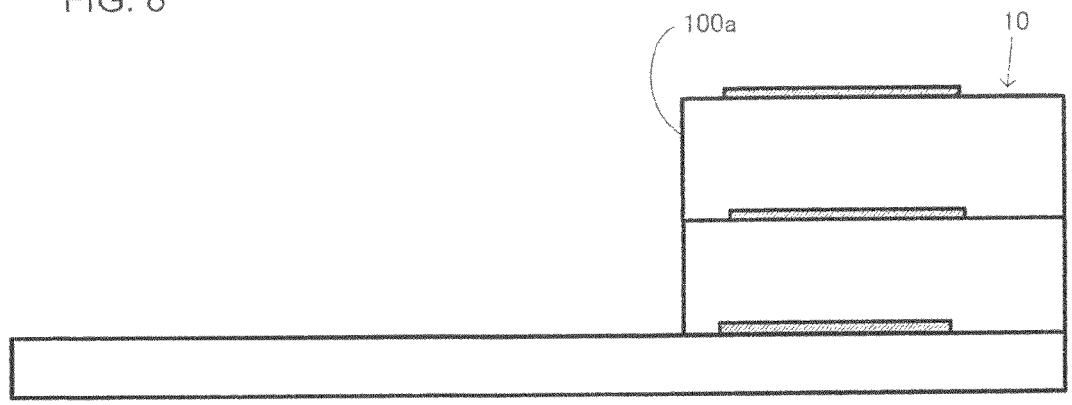
FIG. 8 is a sectional view illustrating a step of forming an indentation in the first substrate.

Next, as illustrated in FIG. 8, the first substrate 10 on the substrate 100 is cut with laser, for example, (laser cut) and a recess portion (indentation portion) (100a) to house (to dispose) a predetermined number (herein, "one unit") of the second substrates 20 is formed. This recess portion (100a) is to be of a shape and size having a gap to the extent that it allows the positioning when the second substrate 20 is disposed (a rectangular parallelepiped-shaped hollow space, for example).

Figure 9:
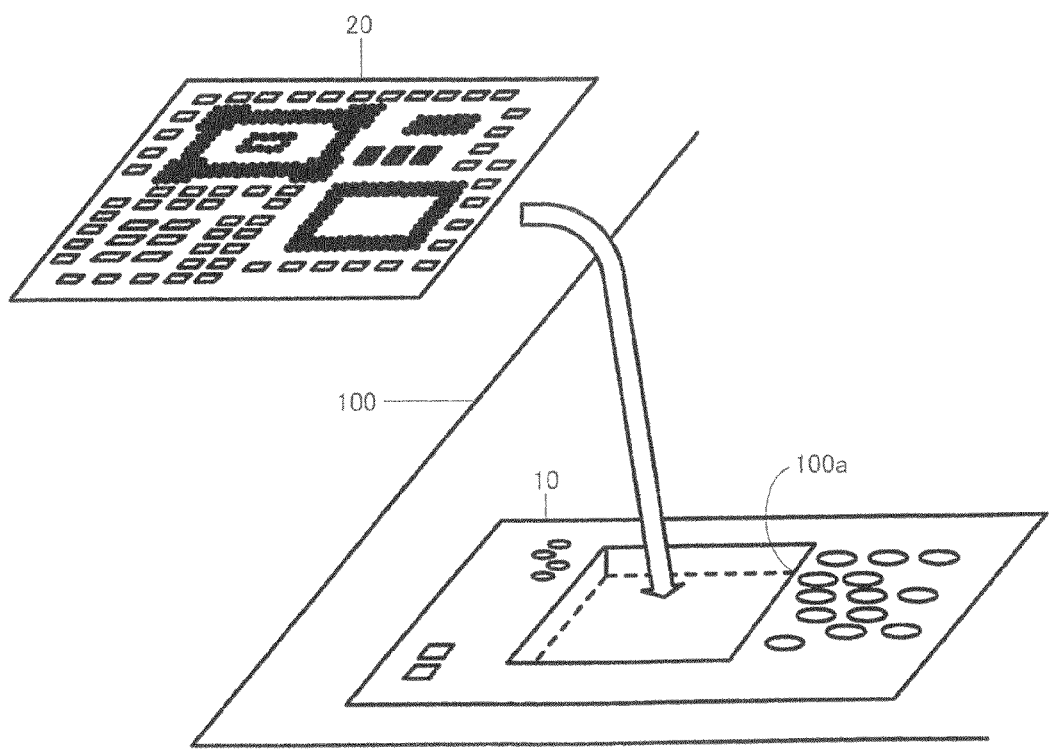
FIG. 9 is a perspective view illustrating a step of disposing the second substrate in the indentation in the first substrate.
Figure 10:
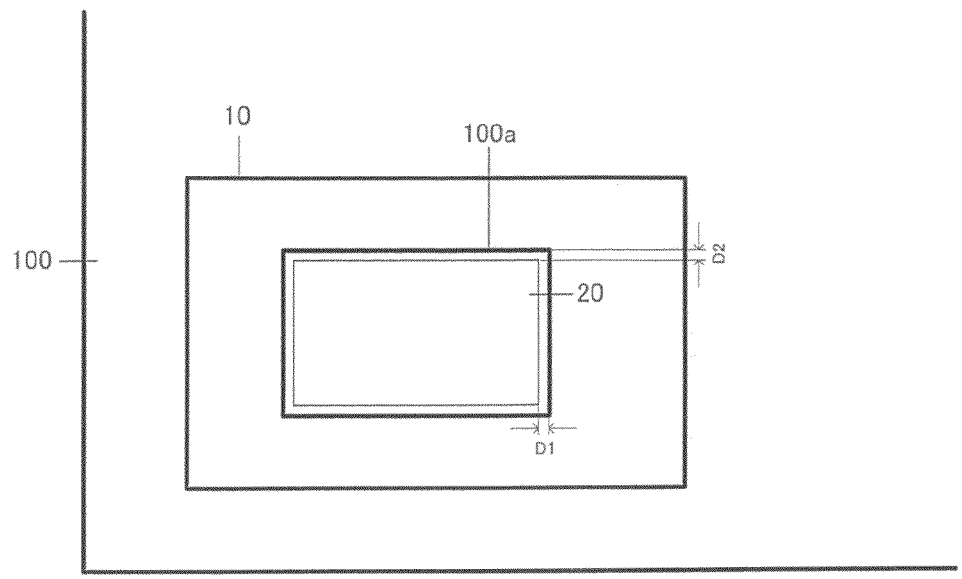
FIG. 10 is a plan view illustrating how the second substrate is disposed in the indentation.
Figure 11:
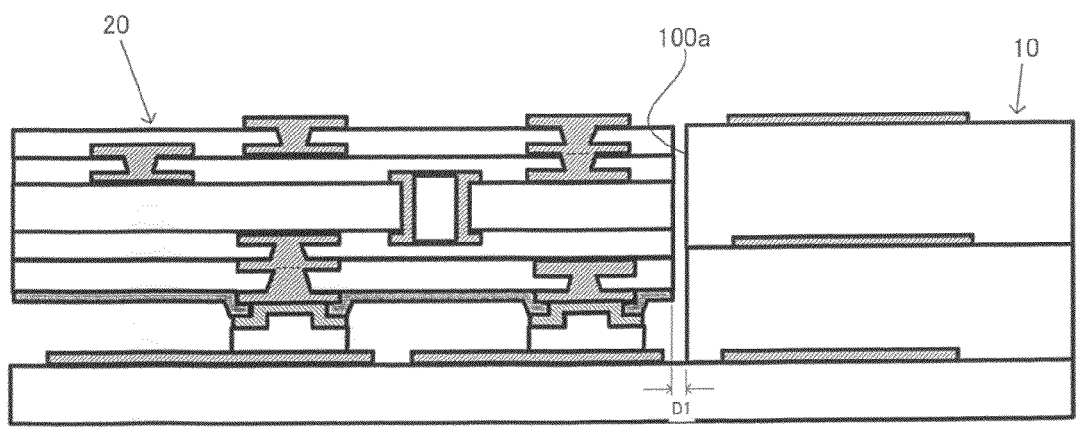
FIG. 11 is a sectional view illustrating how the second substrate is disposed in the indentation.

Continuing on, the second substrate 20 determined to be normal (defect-free) with the above-described inspection is cut out as a chip in a predetermined size with a laser, for example, of a single substrate 200, as illustrated in FIG. 9, and that second substrate 20 chip is housed in the recess portion (indentation portion) (100a) as illustrated in FIG. 10 and FIG. 11 as a plan view and a sectional view respectively, for example. And, the two substrates 10, 20 are mutually flip-chip-connected with solder reflow, etc., for example. At that time, the recess portion (indentation portion) (100a) having a hollow shape corresponding to the outer shape of the second substrate 20, namely, a hollow shape larger only by predetermined gaps (D1, D2) than the second substrate 20 (each being a small enough gap to the extent that it allows the alignment (positioning) of the second substrate 20) allows the second substrate 20 to be positioned in a predetermined position (the position of the recess portion (100a)).

The placement of this second substrate 20 places the surfaces of the first substrate 10 and of the second substrate 20 on a near alignment. However, it is not limited to this, and as long as it is exposed, the surface of the second substrate 10 may be higher or lower than the surface of the first substrate 10.

Figure 12:
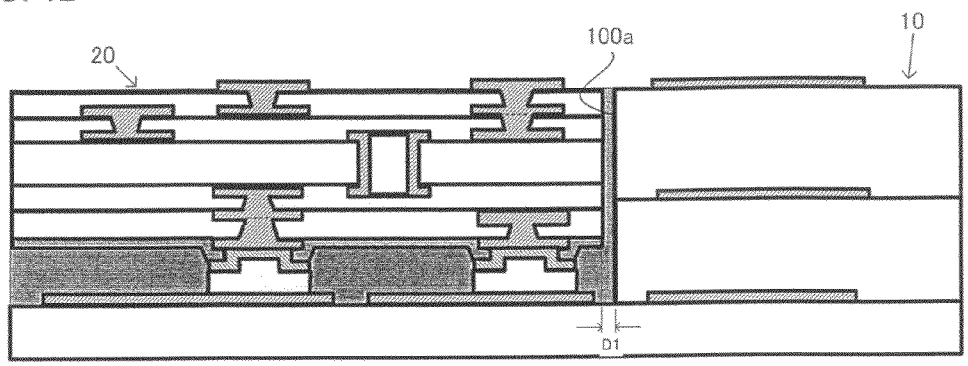
FIG. 12 is a sectional view illustrating how a resin is filled in a space between the second substrate and the indentation.
Figure 13:
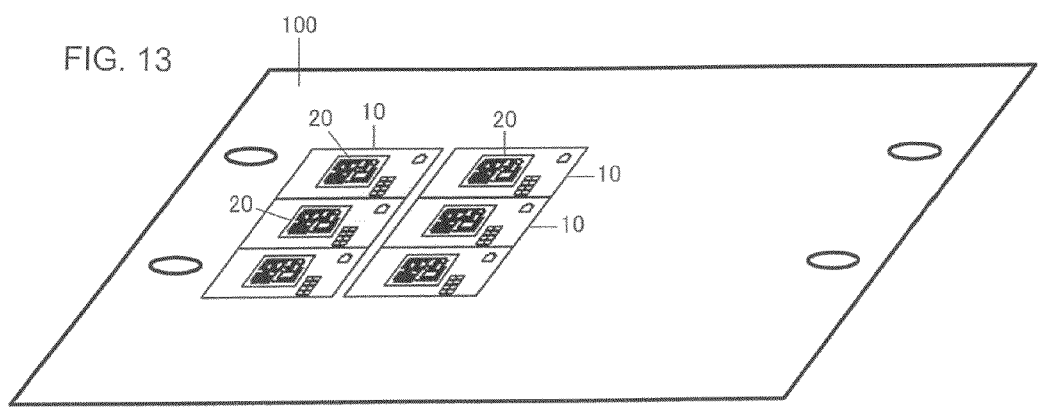
FIG. 13 is a perspective view illustrating a substrate on which printed wiring boards are formed in accordance with the present embodiment.

And, with the use of a dispenser the gaps (D1, D2) between the first substrate 10 and the second substrate 20 (FIG. 10) are filled with a resin 30 as illustrated in FIG. 12. As such, a printed wiring board as illustrated in preceding FIG. 1 is completed. More specifically, as illustrated in FIG. 13, multiple printed wiring boards corresponding to the numbers of the first substrates 10 and the second substrates 20 are formed off of a single substrate 100. Namely, with these printed wiring boards each being cut out as a chip, each chip constitutes an individual product. The structure being as such reduces the wiring layers of the printed wiring boards, resulting in a reduction in unnecessary conductor connection portions enhancing drop-impact resistance.

In addition, one embodiment described in the above may be carried out as modified in the following.

Figure 14:
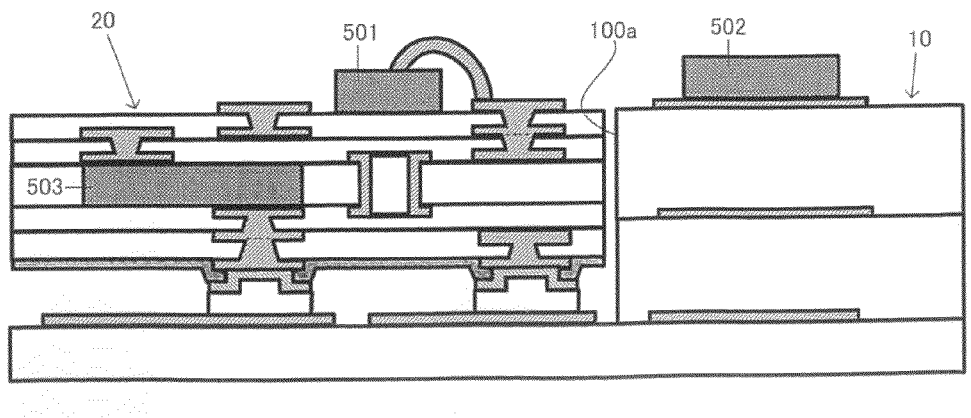
FIG. 14 is a sectional view illustrating a modified example of a printed wiring board.

It may be such that at least one electronic component is electrically connected to at least either the first substrate 10 or the second substrate 20. As illustrated in FIG. 14, for example, electronic components 501, 502 can electrically be connected to the surface of the first substrate 10 or the second substrate 20 with wire bonding, flip-chip mounting, etc., via an LPSR, a metal wire, etc., for example, or an electronic component can be provided inside the second substrate 20 as with an electronic component 503 in the drawing. In addition, the number of electronic components is optional, and it may be such that they are connected to only either the first substrate 10 or the second substrate 20.

Figure 15:
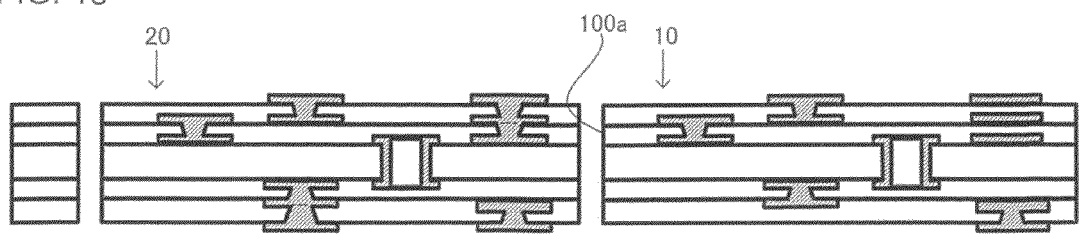
FIG. 15 is a sectional view illustrating a modified example of the first substrate.
Figure 16:
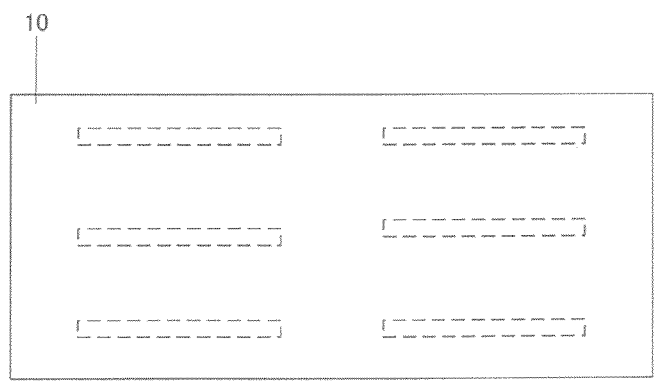
FIG. 16 shows plan views illustrating modified examples of the first substrate and the second substrate.
Figure 17:
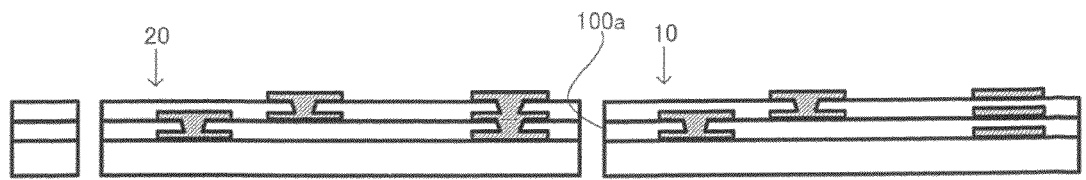
FIG. 17 shows sectional views illustrating modified examples of the first substrate and the second substrate.

The second substrate being higher in the density of conductors present than the first substrate is not limited to one being greater in the number of wiring layers per unit thickness than the first substrate. As illustrated in FIG. 15, for example, the structure may be such that the second substrate 20 is greater in the number of via structures per unit interlaminar insulating layer than the first substrate 10 even when the number of wiring layers per unit thickness is the same between the two substrates (a number of via structures within a given interlaminar insulating layer (a certain interlaminar insulating layer as a unit, "a unit interlaminar insulating layer")). In addition, vias are holes formed in an interlaminar insulating layer and for electrically connecting the lower wiring layer and the upper wiring layer (holes for interlaminar electrical connection), and, besides IVH (Interstitial Via Hole structure), plating through holes, plating micro vias, conductive paste connection holes, etc., for example, may be employed. Further, even when the number of wiring layers and the number of vias described above are the same respectively, the density of conductors present on an insulating layer with respect to the second substrate 20 can be greater than the density of conductors present on an insulating layer with respect to the first substrate 10, as illustrated in FIG. 16, for example. In addition, the thickness of the core substrate of the second substrate 20 may be set to be equivalent to the thickness of the first substrate 10 (refer to FIG. 15, for example). And, as to the first substrate 10 and the second substrate 20, they may have conductors (wiring layers) only on either the front face or the back face of the core, as illustrated in FIG. 17.

Figure 18:
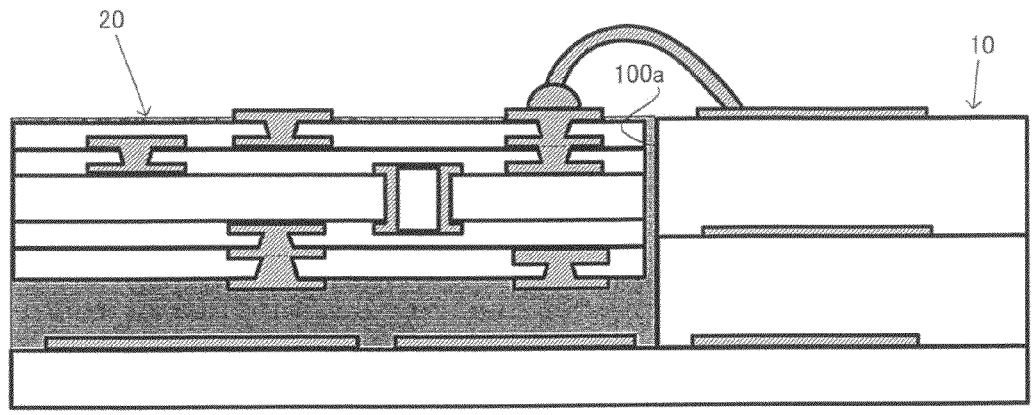
FIG. 18 is a sectional view illustrating a modified example related to the connection embodiment between the first substrate and the second substrate.
Figure 19:
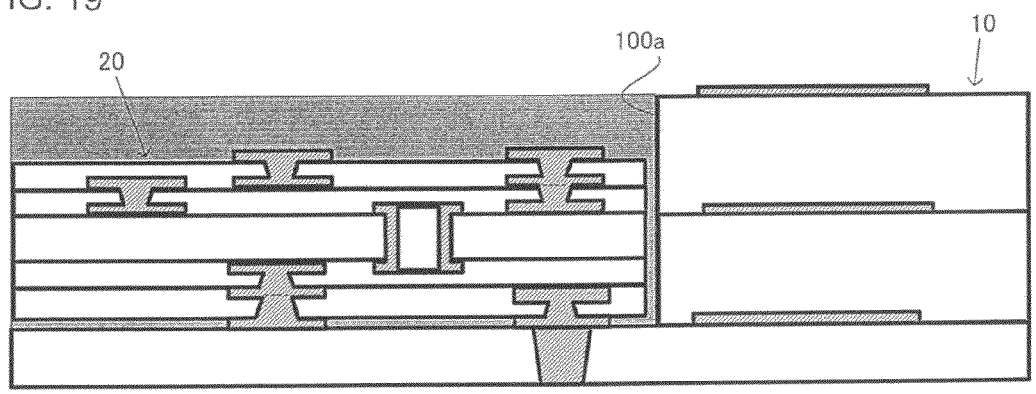
FIG. 19 is a sectional view illustrating another modified example related to the connection embodiment between the first substrate and the second substrate.
Figure 20:
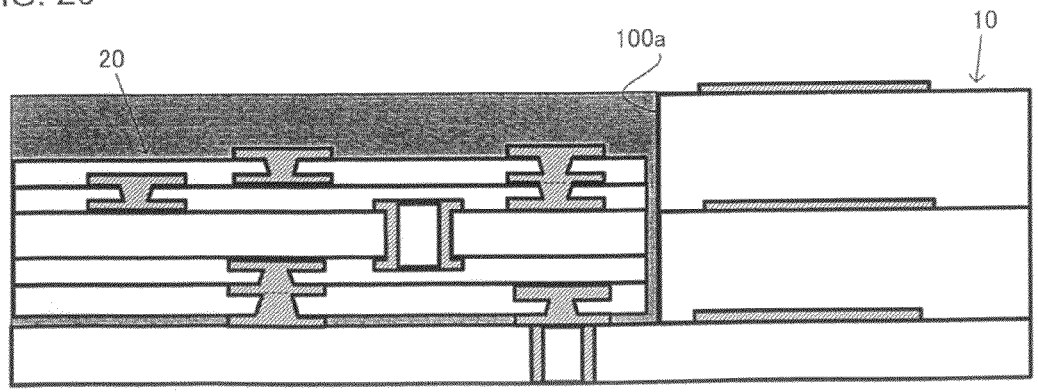
FIG. 20 is a sectional view illustrating another modified example related to the connection embodiment between the first substrate and the second substrate.
Figure 21:
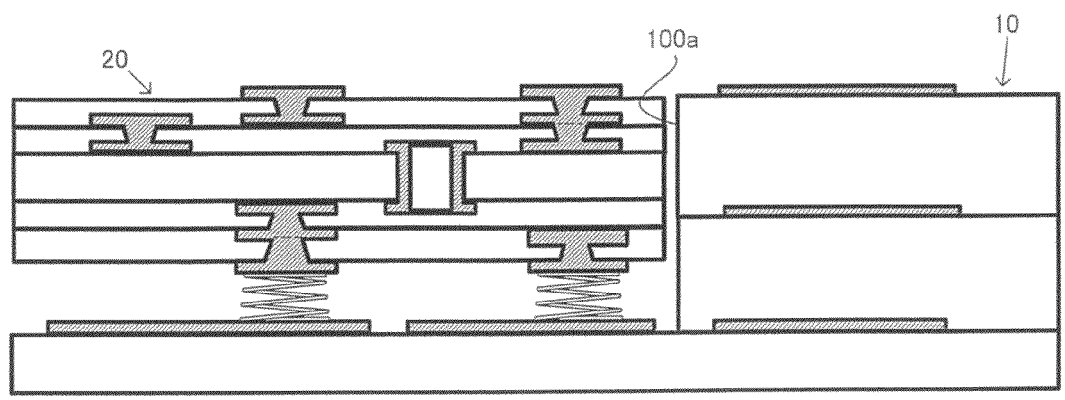
FIG. 21 is a sectional view illustrating another modified example related to the connection embodiment between the first substrate and the second substrate.
Figure 22:
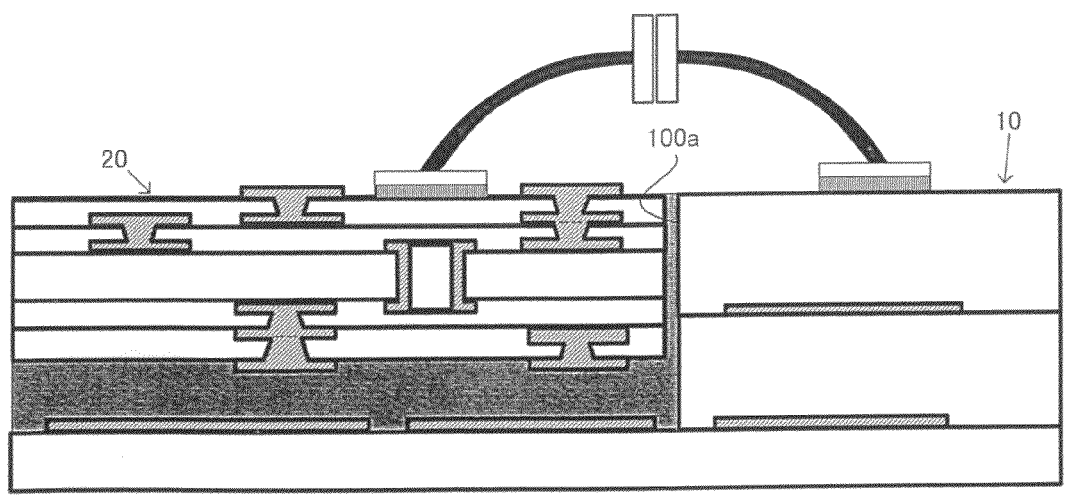
FIG. 22 is a sectional view illustrating another modified example related to the connection embodiment between the first substrate and the second substrate.

The above-described embodiment was such that the first substrate 10 and the second substrate 20 were electrically connected with flip-chip connection. The flip-chip connection of these two substrates allows an electrical connection between the first substrate 10 and the second substrate 20 even when the conductor density of the second substrate 20 ends up being higher. However, it is not limited to this, and a method for connecting the two substrates is optional. As illustrated in FIG. 18, for examples, the two substrates may be electrically connected with wire bonding. And, as illustrates in FIG. 19, for example, it may be that it is built up to the upper layer and the two substrates are electrically connected with vias. When a connection is made with vias, a connection portion having a good electrical connection and high impact resistance can be formed. And, as illustrated in FIG. 20, for example, the two substrates may be electrically connected with a cross-sectional through hole. And, as illustrated in FIG. 21, for example, the two substrates may be electrically connected by pads formed on each of the first substrate 10 and the second substrate 20 being put in contact with each other via springs. Or, as illustrated in FIG. 22, it may be set up such that the two substrates are electrically connected with a connector. In addition, the resin in the gap between the second substrate and the recess portion may be omitted when not necessary (refer to FIG. 21, for example).

Further, the materials, etc., for electrodes and for wiring for connecting the two substrates are also optional. The two substrates may be mutually electrically connected with an ACF (Anisotropic Conductive Film) connection or an Au—Au connection. When it comes to the ACF connection, the positioning of the first substrate 10 and the second substrate 20 for the connection can easily be done. And, when it comes to the Au—Au connection, a connection portion highly resistant to corrosion can be formed.

Figure 23:
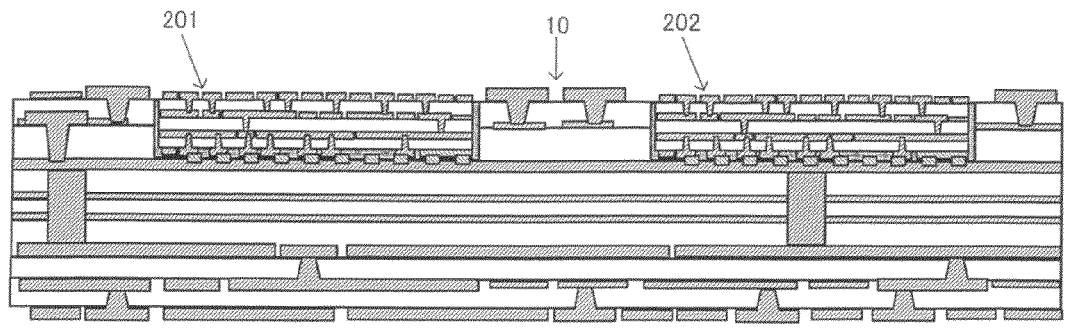
FIG. 23 is a sectional view illustrating a modified example of a printed wiring board.
Figure 24:
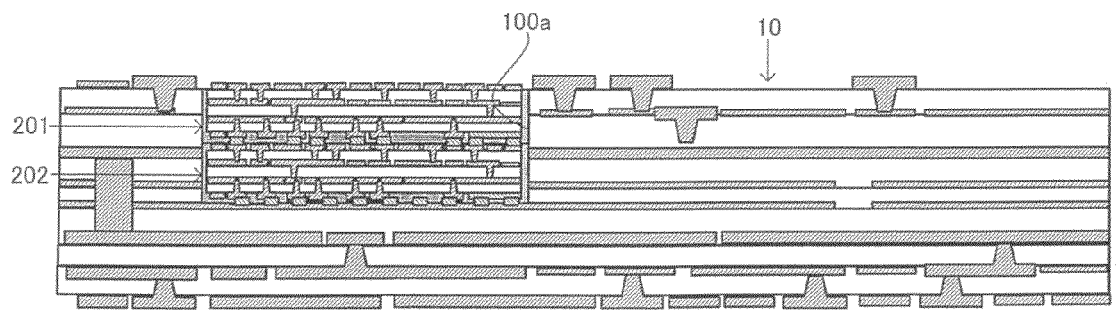
FIG. 24 is a sectional view illustrating another modified example of a printed wiring board.

It may be set up such that multiple second substrates may be disposed on the surface of one first substrate. As illustrated in FIG. 23, for example, it may be set up such that two second substrates 201, 202 (substrates having a high conductor density) are disposed on one first substrate 10 (a substrate having a low conductor density). Or, as illustrated in FIG. 24, multiple second substrates (two substrates 201, 202 in this example) may be housed in one recess portion (100a).

Figure 25:
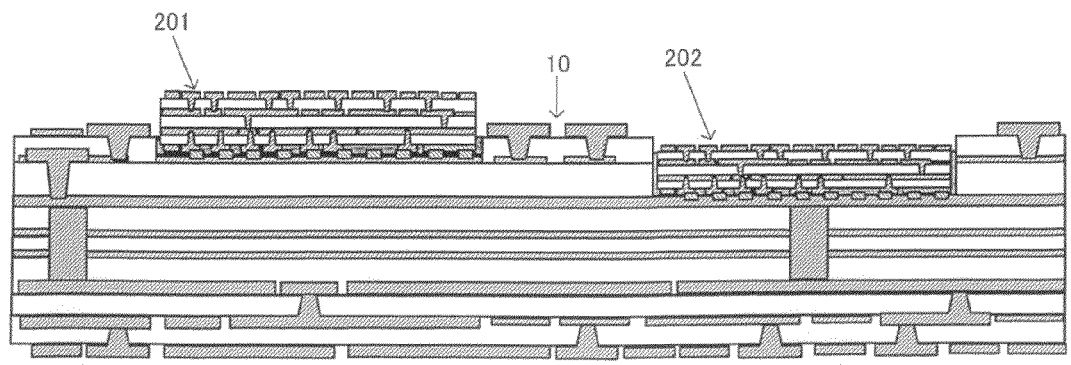
FIG. 25 is a sectional view illustrating another modified example of a printed wiring board.

When it comes to the above-described embodiment, while the two substrates are connected such that the surface of the first substrate and the surface of the second substrate are aligned at the equal height, it is not limited to this, and, as illustrated in FIG. 25, it may be that the surface of the second substrate 201 is higher than the surface of the first substrate 10 (protrudes) or that the surface of the second substrate 202 is lower than the surface of the first substrate 10 (indents).

Figure 26:
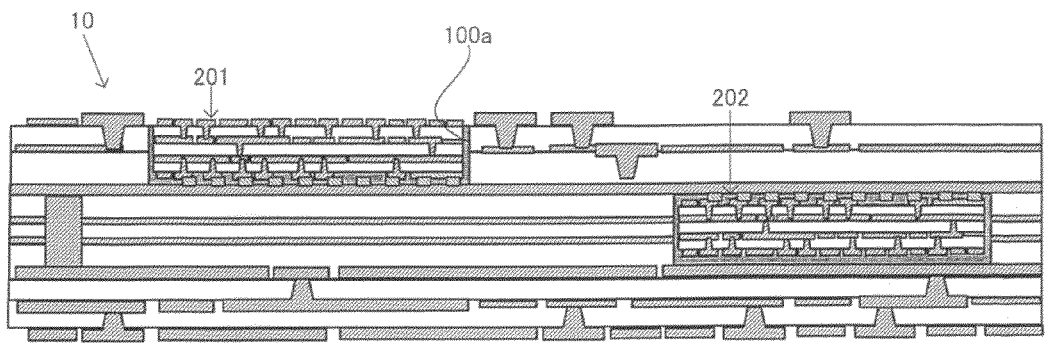
FIG. 26 is a sectional view illustrating another modified example of a printed wiring board.

Further, as illustrated in FIG. 26, it may be such that a high conductor density substrate 201 is disposed in a recess portion (100a) formed in the surface of the first substrate 10 (a low conductor density substrate), and that this substrate 201 and the second substrate 202 embedded in the substrate 201 are combined to form one printed wiring board. The structure being as such, a high-density conductor region can easily be formed on a substrate surface as well as in a substrate.

The materials for the first substrate 10 and the second substrate 20 are optional. These substrates 10, 20 may be composed of the same material as the other and of different materials.

Figure 27:
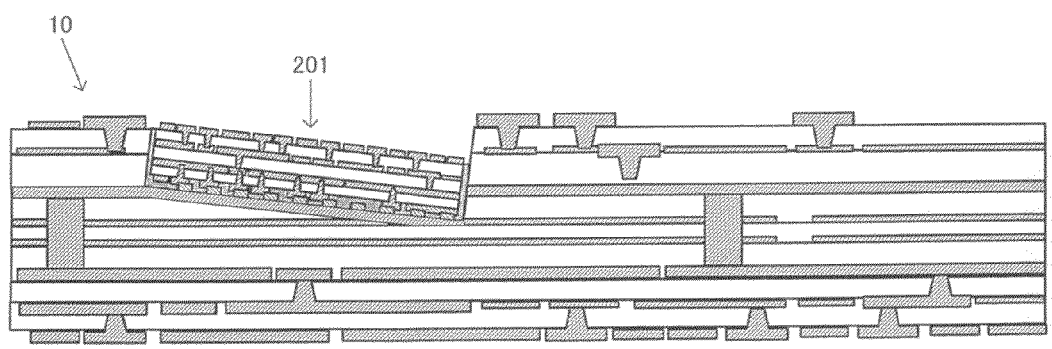
FIG. 27 is a sectional view illustrating another modified example of a printed wiring board.

The shape, position, arrangement at that position, etc., of the second substrate are also optional. As illustrated in FIG. 27, for example, the second substrate 201 (a high-conductor density substrate) may be inclined in the first substrate 10 (a low-conductor density substrate). And, the second substrate may be provided with recess portions (indentation portions) and protruded portions and the second substrate itself may be formed in a V-letter shape.

Figure 28:
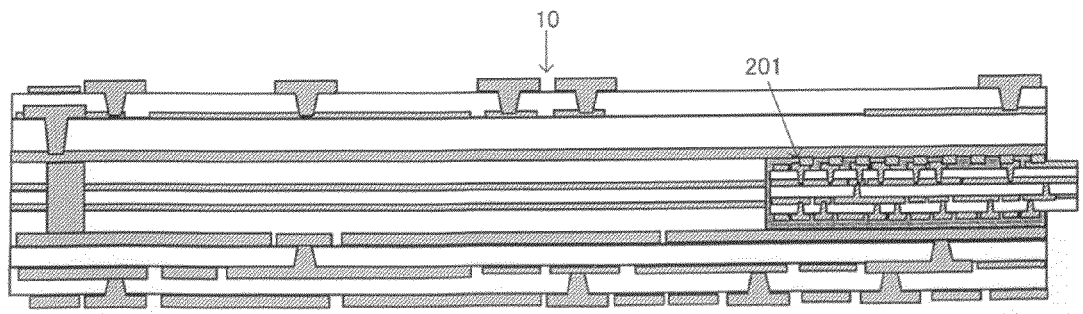
FIG. 28 is a sectional view illustrating another modified example of a printed wiring board.

As illustrated in FIG. 28, for example, it may be such that the second substrate 201 is inserted into the first substrate 10 such that a portion of the main surface of the second substrate 201 is exposed at, not the main surface of the first substrate 10, but the side surface of the first substrate 10.

In the above-described embodiment, while the recess portion (100a) is formed following the inspection of the first substrate 10 and the second substrate 20, it may be such that following the formation of the recess portion (100a) each substrate is inspected.

The shape and size of the recess portion (100a) is optional. However, the shape and size corresponding to the second substrate 20 are preferred in terms of the positioning of the second substrate 20.

Figure 29:
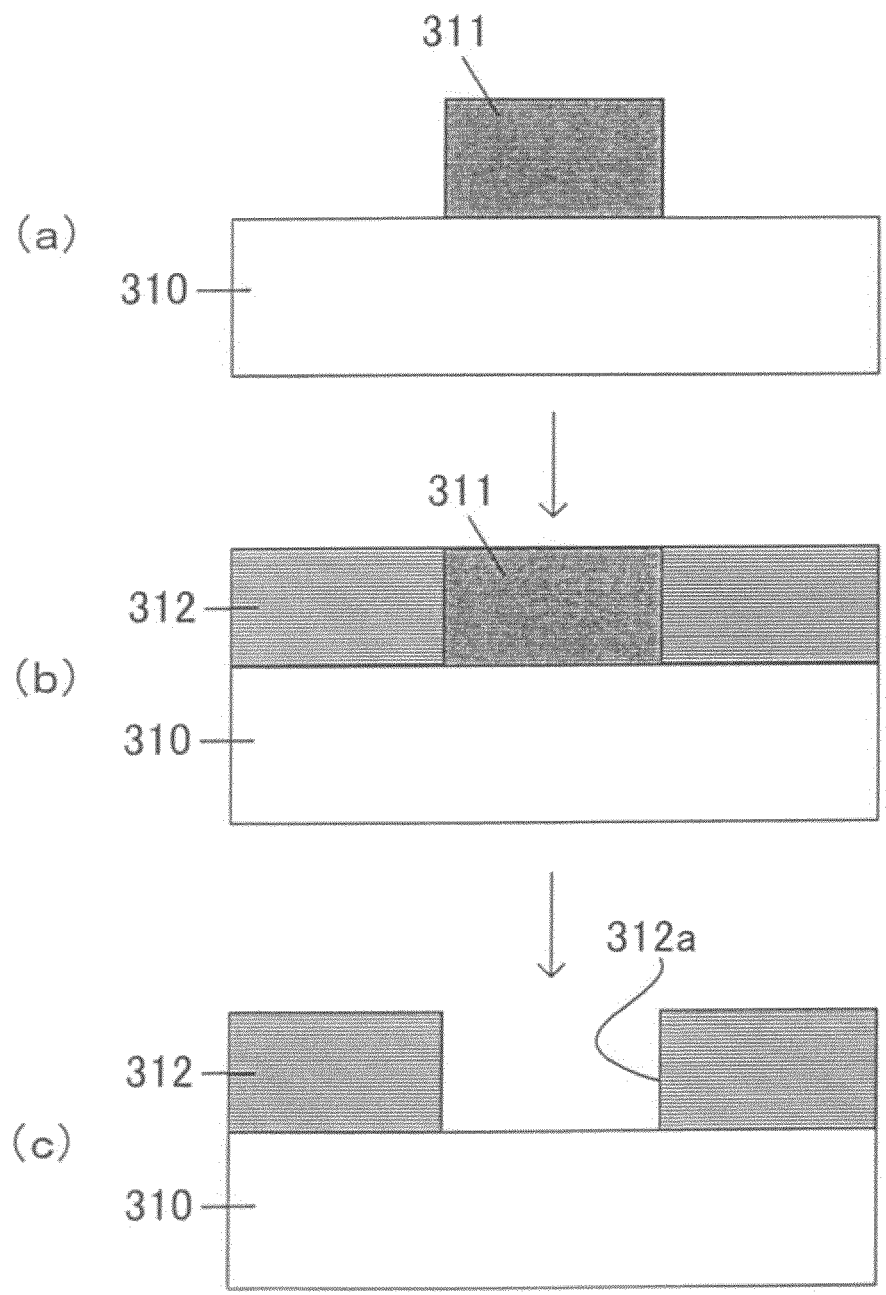
FIGS. 29(a) through (c) are sectional views illustrating a modified example of a method for manufacturing a printed wiring board.

The formation of a recess portion is not limited to a method of removing a portion corresponding to the space thereof with laser, etching, etc., and it may be that while a sacrificial material 311 is in advance provided on a substrate 310, as illustrated in FIG. 29(a), for example, a multilayer film 312 (while it is a multilayer in this example, it could be a single layer) is formed, as illustrated in FIG. 29(b), and that the sacrificial material 311 is removed with selective etching, etc., following the film formation to form a recess portion (312a).

The features of a printed wiring board pertaining to the first aspect in accordance with the present invention are such that it is provided with the first substrate on which conductors are formed and with at least one second substrate wherein the density of conductors present is higher than that of the first substrate, that the previously-described second substrate is inserted into the previously-described first substrate such that at least a portion of the main surface of the previously-described second substrate is exposed at the surface of the previously-described first substrate, and concurrently that the conductors on the previously-described first substrate and the conductors on the previously-described second substrate are electrically connected.

The structure may be such that the number of wiring layers formed with the conductors on the previously-described second substrate is greater than the number of wiring layers of the previously-described first substrate in the region having the same thickness as that of the previously-described second substrate.

The structure may be such that each of the previously-described first substrate and the previously-described second substrate has an insulating layer and that the density of conductors present on the insulating layer of the previously-described second substrate is formed such that it is higher than the density of the conductors present on the insulating layer of the previously-described first substrate.

The structure may be such that the previously-described first substrate and the previously-described second substrate have a lower wiring layer and an upper wiring layer electrically connected via vias in an interlaminar insulating layer and that the number of vias per unit interlaminar insulating layer with respect to the previously-described second substrate is greater than the number of vias per unit interlaminar insulating layer with respect to the previously-described first substrate.

The structure may be such that the previously-described first substrate and the previously-described second substrate are electrically connected with flip chip connection.

The structure may be such that the previously-described first substrate and the previously-described second substrate are spacedly disposed and that there is present a resin in at least a portion of the space between the previously-described first substrate and the previously-described second substrate.

The structure may be such that at least one of the previously-described first substrate and the previously-described second substrate has an insulating layer containing an inorganic material.

The structure may be such that at least one of the insulating layer of the previously-described first substrate and the insulating layer of the previously-described second substrate has at least one cloth layer with the previously-described inorganic material.

The structure may be such that the number of insulating layers containing the inorganic material of the previously-described first substrate is greater than the number of insulating layers containing the inorganic material of the previously-described second substrate.

The structure may be such that the thickness of at least a portion of the conductors of the previously-described second substrate is no greater than the thickness of the conductors of the previously-described first substrate.

The structure may be such that at least one electronic component is electrically connected to at least one of the previously-described first substrate or the previously-described second substrate.

The structure may be such that at least one electronic component is electrically connected to the previously-described second substrate.

The features of a method for manufacturing a printed wiring board pertaining to the second aspect in accordance with the present invention are such that it comprises the first step of fabricating the first substrate having conductors, the second step of fabricating with a single substrate a considerable number of the second substrates having conductors, the third step of forming an indentation in the first substrate fabricated with the previously-described first step, the fourth step of disposing, of the previously-described second substrates, one or more substrates in the indentation formed with the previously-described third step, and the fifth step of electrically connecting the conductors of the previously-described first substrate and the conductors of the previously-described second substrates.

It may be such that a step of substrate inspection for inspecting, prior to the previously-described fourth step, the pass or failure of each of the first substrate fabricated with the previously-described first step and the second substrates fabricated with the previously-described second step is provided, and that one or more substrates of the second substrates determined to be normal under the previously-described substrate inspection step are disposed in the previously-described indentation in the first substrate determined to be normal under the previously-described substrate inspection step.

It may be such that under the previously-described third step an indentation having a space to the extent that it allows the determination of the positioning when the previously-described second substrates are disposed.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board comprising:
   a first substrate having a recess portion and a plurality of conductors; and a second substrate having a plurality of conductors and inserted in the recess portion of the first substrate such that the first substrate has a surface exposing at least a portion of a surface of the second substrate, wherein the plurality of conductors in the first substrate is electrically connected to the plurality of conductors in the second substrate, the second substrate has a conductor density which is higher than a conductor density in the first substrate, and the second substrate has a core substrate comprising an inorganic material, a plurality of first interlaminar insulating layers formed on a first surface of the core substrate and a plurality of second interlaminar insulating layers formed on a second surface of the core substrate on an opposite side of the first surface of the core substrate.

2. A printed wiring board as set forth in claim 1, wherein the plurality of conductors of the first substrate is formed in a plurality of wiring layers, the plurality of conductors of the second substrate is formed in a plurality of wiring layers, and a number of the wiring layers in the second substrate is greater than a number of the wiring layers in the first substrate in a region having a same thickness as the second substrate.

3. A printed wiring board as set forth in claim 1, wherein the first substrate has an insulating layer structure in which the conductors of the first substrate are formed, the second substrate has an insulating layer structure comprising the core substrate and the first and second interlaminar insulating layers, the conductors of the second substrate are formed in the insulating layer structure of the second substrate, the insulating layer structure of the second substrate has the conductor density which is higher than the conductor density in the insulating layer structure of the first substrate.

4. A printed wiring board as set forth in claim 1, wherein the first substrate includes an interlaminar insulating layer, a lower wiring layer and an upper wiring layer formed of the conductors of the first substrate and a plurality of via structures electrically connecting the upper and lower wiring layers through the interlaminar insulating layer, the second substrate includes a plurality of via structures electrically connecting the conductors through the first and second interlaminar insulating layers in the second substrate, and a number of via structures per interlaminar insulating layer with respect to the second substrate is greater than a number of via structures per interlaminar insulating layer with respect to the first substrate.

5. A printed wiring board as set forth in claim 1, wherein the second substrate is electrically connected to the first substrate with flip chip connection.

6. A printed wiring board as set forth in claim 1, wherein the second substrate is inserted in the recess portion of the first substrate with a space between the first substrate and the second substrate, and at least a portion of the space is filled with a resin.

7. A printed wiring board as set forth in claim 1, wherein the first substrate has an insulating layer comprising an inorganic material.

8. A printed wiring board as set forth in claim 7, wherein the insulating layer of the first substrate has at least one cloth layer comprising the inorganic material.

9. A printed wiring board as set forth in claim 1, wherein the first substrate has a plurality of insulating layers each comprising an inorganic material, and a number of the insulating layers in the first substrate is greater than a number of the first and second interlaminar insulating layers and core substrate in the second substrate.

10. A printed wiring board as set forth in claim 1, wherein the conductors in the second substrate include a portion of which a thickness is no greater than a thickness of the conductors in the first substrate.

11. A printed wiring board as set forth in claim 1, further comprising at least one electronic component electrically connected to at least one of the first substrate and the second substrate.

12. A printed wiring board as set forth in claim 1, further comprising an electronic component electrically connected to the second substrate.

13. A printed wiring board as set forth in claim 1, wherein the surface of the second substrate is exposed at the surface of the first substrate.

14. A printed wiring board as set forth in claim 1, wherein the second substrate has a plurality of via structures comprising plating materials filling via holes, respectively, the plurality of conductors of the second substrate is formed in a plurality of wiring layers, and the plurality of wiring layers are connected by the plurality of via structures.

15. A printed wiring board as set forth in claim 1, further comprising an Anisotropic Conductive Film electrically connecting the conductors of the first substrate and the conductors of the second substrate.

16. A printed wiring board as set forth in claim 1, wherein the second substrate further comprises a passivation layer facing the first substrate.

17. A printed wiring board as set forth in claim 1, wherein the second substrate further comprises a passivation layer facing the first substrate, and the passivation layer has an opening exposing a portion of an outermost conductor of the conductors in the second substrate.

18. A printed wiring board as set forth in claim 1, wherein the second substrate further comprises a passivation layer facing the first substrate, the passivation layer has an opening exposing a portion of an outermost conductor of the conductors in the second substrate, and the second substrate has a buffer layer formed on the portion of the outermost conductor of the conductors in the second substrate.

19. A printed wiring board as set forth in claim 1, wherein the second substrate has a through-hole structure extending through the core substrate.

* * * * *